United States Patent
Huang et al.

(10) Patent No.: US 11,257,904 B2
(45) Date of Patent: Feb. 22, 2022

(54) SOURCE-CHANNEL JUNCTION FOR III-V METAL-OXIDE-SEMICONDUCTOR FIELD EFFECT TRANSISTORS (MOSFETS)

(71) Applicant: Intel Corporation, Santa Clara, CA (US)

(72) Inventors: Cheng-Ying Huang, Hillsboro, OR (US); Tahir Ghani, Portland, OR (US); Jack Kavalieros, Portland, OR (US); Anand Murthy, Portland, OR (US); Harold Kennel, Portland, OR (US); Gilbert Dewey, Beaverton, OR (US); Matthew Metz, Portland, OR (US); Willy Rachmady, Beaverton, OR (US); Sean Ma, Portland, OR (US); Nicholas Minutillo, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 726 days.

(21) Appl. No.: 16/024,706

(22) Filed: Jun. 29, 2018

(65) Prior Publication Data

US 2020/0006480 A1 Jan. 2, 2020

(51) Int. Cl.
| | |
|---|---|
| *H01L 29/06* | (2006.01) |
| *H01L 29/10* | (2006.01) |
| *H01L 29/08* | (2006.01) |
| *H01L 29/205* | (2006.01) |
| *H01L 29/417* | (2006.01) |
| *H01L 29/66* | (2006.01) |

(Continued)

(52) U.S. Cl.
CPC .... *H01L 29/0684* (2013.01); *H01L 21/02543* (2013.01); *H01L 21/02546* (2013.01); *H01L 29/0669* (2013.01); *H01L 29/0847* (2013.01); *H01L 29/1033* (2013.01); *H01L 29/205* (2013.01); *H01L 29/41758* (2013.01); *H01L 29/66522* (2013.01); *H01L 29/66795* (2013.01); *H01L 29/7851* (2013.01)

(58) Field of Classification Search
CPC ............ H01L 29/0684; H01L 29/0669; H01L 29/785; H01L 29/66795; H01L 29/66522; H01L 29/1054
See application file for complete search history.

(56) References Cited

U.S. PATENT DOCUMENTS

2017/0047404 A1* 2/2017 Bentley ............. H01L 29/66795

* cited by examiner

*Primary Examiner* — Changhyun Yi
(74) *Attorney, Agent, or Firm* — Schwabe, Williamson & Wyatt P.C.

(57) ABSTRACT

Embodiments herein describe techniques, systems, and method for a semiconductor device. Embodiments herein may present a semiconductor device having a channel area including a channel III-V material, and a source area including a first portion and a second portion of the source area. The first portion of the source area includes a first III-V material, and the second portion of the source area includes a second III-V material. The channel III-V material, the first III-V material and the second III-V material may have a same lattice constant. Moreover, the first III-V material has a first bandgap, and the second III-V material has a second bandgap, the channel III-V material has a channel III-V material bandgap, where the channel material bandgap, the second bandgap, and the first bandgap form a monotonic sequence of bandgaps. Other embodiments may be described and/or claimed.

25 Claims, 8 Drawing Sheets

If InGaAsP is graded along this line, all InGaAsP layers will be latticed matched to InP and $In_{0.53}Ga_{0.47}As$

(51) Int. Cl.
*H01L 21/02* (2006.01)
*H01L 29/78* (2006.01)

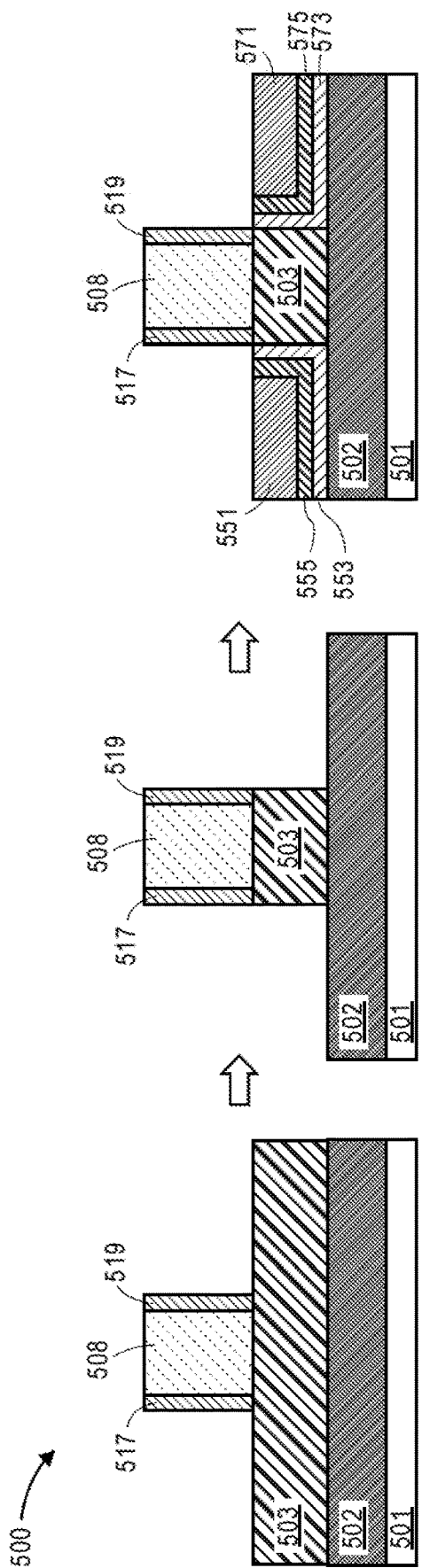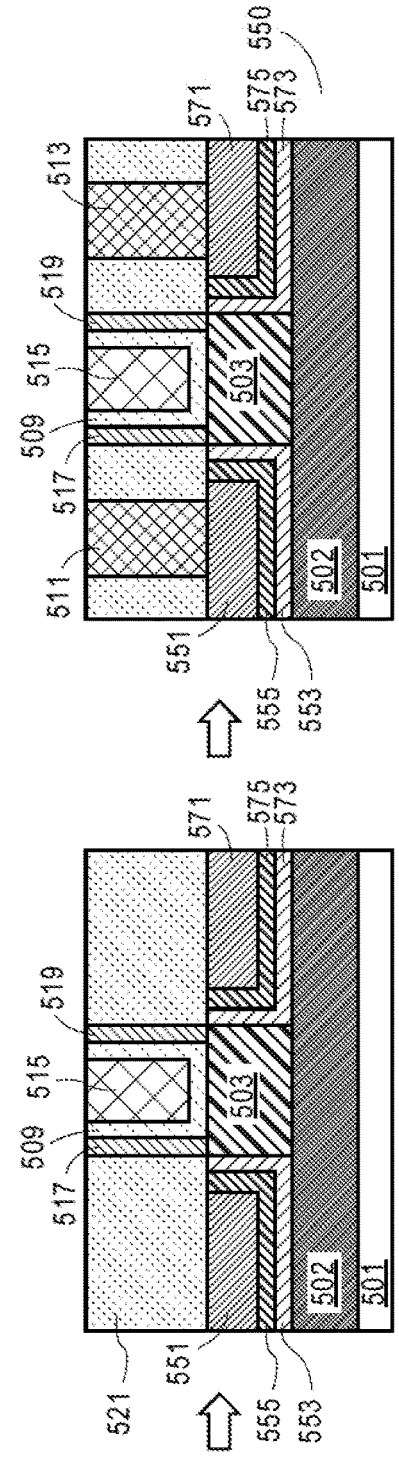

SOURCE-CHANNEL JUNCTION FOR III-V METAL-OXIDE-SEMICONDUCTOR FIELD EFFECT TRANSISTORS (MOSFETS)

FIELD

Embodiments of the present disclosure generally relate to the field of integrated circuits, and more particularly, to III-V metal-oxide-semiconductor field effect transistors (MOSFETs).

BACKGROUND

The background description provided herein is for the purpose of generally presenting the context of the disclosure. Unless otherwise indicated herein, the materials described in this section are not prior art to the claims in this application and are not admitted to be prior art by inclusion in this section.

Traditional integrated circuits, e.g., metal-oxide-semiconductor field effect transistors (MOSFETs), may be based on silicon. On the other hand, compounds of group III-V elements may have superior semiconductor properties than silicon, including higher electron mobility and saturation velocity, leading to better performance for III-V MOSFETs. However, there may be an electron energy barrier in a source-channel junction for an III-V MOSFET, or simply an III-V transistor. Such an electron energy barrier may cause current choke for an III-V MOSFET, leading to reduced performance.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

FIGS. 5(a)-5(g) schematically illustrate an example process for forming an III-V MOSFETs including a source area with multiple portions, where a bandgap of a channel material and bandgaps of the multiple portions of the source area form a monotonic sequence of bandgaps, in accordance with some embodiments.

DETAILED DESCRIPTION

Figure 1:
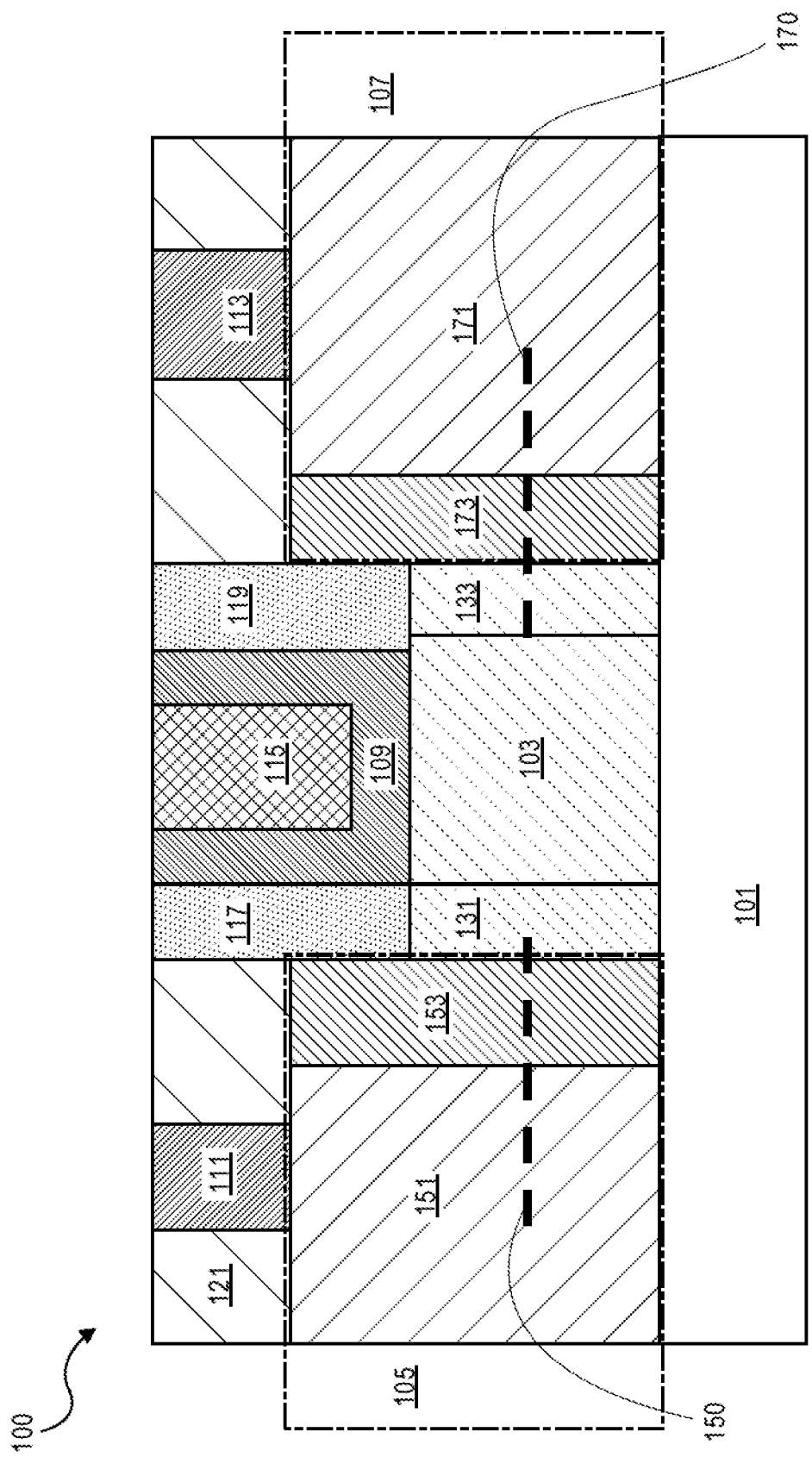
FIG. 1 schematically illustrates an example III-V metal-oxide-semiconductor field effect transistor (MOSFET) including a source area with multiple portions, where a bandgap of a channel material and bandgaps of the multiple portions of the source area form a monotonic sequence of bandgaps, in accordance with some embodiments.

Compounds of group III-V elements such as gallium arsenide (GaAs), indium antimonide (InSb), indium phosphide (InP), and indium gallium arsenide (InGaAs) have superior semiconductor properties than silicon, including higher electron mobility and saturation velocity. As a result, III-V metal-oxide-semiconductor field effect transistors (MOSFETs) may have better performance than silicon transistors as well. An III-V MOSFET may include a source area and a drain area adjacent to a channel area. For the description below, a source area and a drain area may be used interchangeably. A source-channel junction may refer to an interface between a source area and a channel area of an III-V MOSFET.

A source-channel junction of an III-V MOSFET may have an electron energy barrier caused by different materials of the source area and the channel area, leading to current choke and reduced performance. For example, an InGaAs/InP source-channel junction may be an abrupt junction with 0.2 eV conduction offset, creating an electron energy barrier with a large resistance at the source-channel junction. Such an abrupt source-channel junction may further degrade the on-state current of the III-V MOSFET.

In embodiments, to smooth an abrupt source-channel junction of an III-V MOSFET, a sequence of multiple portions of III-V layers, e.g., InGaAsP layers, may be used to smooth the conduction band discontinuity of the source-channel junction. A source area may include multiple portions with different bandgaps. A bandgap of a channel material and the bandgaps of the multiple portions of the source area may form a monotonic sequence of bandgaps. Accordingly, a bandgap difference between two adjacent portions of the source area or with the channel area is reduced. As a result, the sequence of multiple portions of III-V layers of a source-channel junction may provide a lower leakage and a higher on-state current compared to the III-V MOSFET with the abrupt source-channel junction. For example, to reduce a conduction band discontinuity of a source-channel junction between a source area with InGaAs and a channel area with InP, a sequence of III-V materials with various composition of InGaAsP may be selected along a lattice constant, bandgap, and III-V material composition curve so that the chosen materials may have a same lattice constant, while forming a monotonic sequence of bandgaps. As a result, the III-V MOSFET may have reduced source/drain resistance and improved performance.

Embodiments herein may present a semiconductor device. The semiconductor device may include a substrate, a channel area above the substrate and including a channel III-V material, and a source area above the substrate. The source area may include a first portion and a second portion of the source area. An interface between the channel area and the source area may include the channel III-V material. The second portion of the source area is adjacent to the interface between the channel area and the source area, while the first portion of the source area is separated from the interface between the channel area and the source area by the second portion of the source area. The first portion of the source area includes a first III-V material, and the second portion of the source area includes a second III-V material. The channel III-V material has a channel material bandgap and a lattice constant. The first III-V material and the second III-V material may have the same lattice constant as the lattice constant of the channel III-V material. Moreover, the first III-V material has a first bandgap, and the second III-V material has a second bandgap, where the channel material bandgap, the second bandgap, and the first bandgap form a monotonic sequence of bandgaps.

Embodiments herein may present a method for forming a semiconductor device. The method may include forming a channel area above a substrate, forming a second portion of a source area above the substrate adjacent to the channel area, and forming a first portion of the source area above the substrate adjacent to the second portion of the source area. The channel area includes a channel III-V material, the second portion of the source area includes a second III-V material, and the first portion of the source area includes a first III-V material. The channel III-V material, the second III-V material, and the first III-V material may have a same lattice constant. In addition, the channel III-V material has a channel material bandgap, the first III-V material has a first bandgap, and the second III-V material has a second bandgap, where the channel material bandgap, the second bandgap, and the first bandgap form a monotonic sequence of bandgaps.

Embodiments herein may present a computing device. The computing device may include a processor and a memory device coupled to the processor. The memory device or the processor includes a transistor. The transistor may include a substrate, a channel area above the substrate and including a channel III-V material, and a source area above the substrate. The source area may include a first portion and a second portion of the source area. An interface between the channel area and the source area may include the channel III-V material. The second portion of the source area is adjacent to the interface between the channel area and the source area, while the first portion of the source area is separated from the interface between the channel area and the source area by the second portion of the source area. The first portion of the source area includes a first III-V material, and the second portion of the source area includes a second III-V material. The channel III-V material has a channel material bandgap and a lattice constant. The first III-V material and the second III-V material may have the same lattice constant as the lattice constant of the channel III-V material. Moreover, the first III-V material has a first bandgap, and the second III-V material has a second bandgap, where the channel material bandgap, the second bandgap, and the first bandgap form a monotonic sequence of bandgaps.

In the following description, various aspects of the illustrative implementations will be described using terms commonly employed by those skilled in the art to convey the substance of their work to others skilled in the art. However, it will be apparent to those skilled in the art that the present disclosure may be practiced with only some of the described aspects. For purposes of explanation, specific numbers, materials and configurations are set forth in order to provide a thorough understanding of the illustrative implementations. However, it will be apparent to one skilled in the art that the present disclosure may be practiced without the specific details. In other instances, well-known features are omitted or simplified in order not to obscure the illustrative implementations.

Various operations will be described as multiple discrete operations, in turn, in a manner that is most helpful in understanding the present disclosure. However, the order of description should not be construed to imply that these operations are necessarily order dependent. In particular, these operations may not be performed in the order of presentation.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The terms "over," "under," "between," "above," and "on" as used herein may refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening features.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

In various embodiments, the phrase "a first feature formed, deposited, or otherwise disposed on a second feature" may mean that the first feature is formed, deposited, or disposed over the second feature, and at least a part of the first feature may be in direct contact (e.g., direct physical and/or electrical contact) or indirect contact (e.g., having one or more other features between the first feature and the second feature) with at least a part of the second feature.

Where the disclosure recites "a" or "a first" element or the equivalent thereof, such disclosure includes one or more such elements, neither requiring nor excluding two or more such elements. Further, ordinal indicators (e.g., first, second, or third) for identified elements are used to distinguish between the elements, and do not indicate or imply a required or limited number of such elements, nor do they indicate a particular position or order of such elements unless otherwise specifically stated.

As used herein, the term "circuitry" may refer to, be part of, or include an Application Specific Integrated Circuit (ASIC), an electronic circuit, a processor (shared, dedicated, or group), and/or memory (shared, dedicated, or group) that execute one or more software or firmware programs, a combinational logic circuit, and/or other suitable hardware components that provide the described functionality. As used herein, "computer-implemented method" may refer to any method executed by one or more processors, a computer system having one or more processors, a mobile device such as a smartphone (which may include one or more processors), a tablet, a laptop computer, a set-top box, a gaming console, and so forth.

Implementations of the disclosure may be formed or carried out on a substrate, such as a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope of the present disclosure.

A plurality of transistors, such as metal-oxide-semiconductor field-effect transistors (MOSFET or simply MOS transistors), may be fabricated on the substrate. In various implementations of the disclosure, the MOS transistors may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors. Although the implementations described herein may illustrate only planar transistors, it should be noted that the disclosure may also be carried out using nonplanar transistors.

Each MOS transistor includes a gate stack formed of at least two layers, a gate dielectric layer and a gate electrode layer. The gate dielectric layer may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer is formed on the gate dielectric layer and may consist of at least one P-type work function metal or N-type work function metal, depending on whether the transistor is to be a PMOS or an NMOS transistor. In some implementations, the gate electrode layer may consist of a stack of two or more metal layers, where one or more metal layers are work function metal layers and at least one metal layer is a fill metal layer. Further metal layers may be included for other purposes, such as a barrier layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a work function that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a work function that is between about 3.9 eV and about 4.2 eV.

In some implementations, when viewed as a cross-section of the transistor along the source-channel-drain direction, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the disclosure, the gate electrode may consist of a combination of U-shaped structures and planar, non-U-shaped structures. For example, the gate electrode may consist of one or more U-shaped metal layers formed atop one or more planar, non-U-shaped layers.

In some implementations of the disclosure, a pair of sidewall spacers may be formed on opposing sides of the gate stack that bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process operations. In an alternate implementation, a plurality of spacer pairs may be used, for instance, two pairs, three pairs, or four pairs of sidewall spacers may be formed on opposing sides of the gate stack.

As is well known in the art, source and drain regions are formed within the substrate adjacent to the gate stack of each MOS transistor. The source and drain regions are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. And in further embodiments, one or more layers of metal and/or metal alloys may be used to form the source and drain regions.

One or more interlayer dielectrics (ILD) are deposited over the MOS transistors. The ILD layers may be formed using dielectric materials known for their applicability in integrated circuit structures, such as low-k dielectric materials. Examples of dielectric materials that may be used include, but are not limited to, silicon dioxide ($SiO_2$), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant.

FIG. 1 schematically illustrates an example III-V MOSFET 100 including a source area 105 with multiple portions, e.g., a first portion 151, and a second portion 153, where a bandgap of a channel material and bandgaps of the multiple portions of the source area form a monotonic sequence of bandgaps, in accordance with some embodiments. For clarity, features of the III-V MOSFET 100, the source area 105, the first portion 151, and the second portion 153, may be described below as examples for understanding an III-V MOSFET, a source area, and multiple portions of the source area. Further, it is to be understood that one or more of the components of an III-V MOSFET, a source area, and multiple portions of the source area may include additional and/or varying features from the description below, and may include any device that one having ordinary skill in the art would consider and/or refer to as an III-V MOSFET, a source area, and multiple portions of the source area.

In embodiments, the III-V MOSFET 100 may include a substrate 101. A channel area 103 may be above the substrate 101. The source area 105 including the first portion 151, and the second portion 153 may be above the substrate 101 and adjacent to the channel area 103 with an interface 131. A source electrode 111 may be coupled to the source area 105 at the first portion 151. The III-V MOSFET 100 may further include a drain area 107 above the substrate 101 and adjacent to the channel area 103 with an interface 133. The drain area 107 may include a first portion 171, and a second portion 173. A drain electrode 113 may be coupled to the drain area 107 at the first portion 171. A high-k gate dielectric layer 109 may be on the channel area 103. A gate electrode 115 may be separated from the channel area 103 by the high-k gate dielectric layer 109. A spacer 117 may be between the source electrode 111 and the gate electrode 115, and a spacer 119 may be between the drain electrode 113 and the gate electrode 115. Furthermore, the source electrode 111, the drain electrode 113, and the gate electrode 115 may be within an ILD layer 121. When the III-V MOSFET 100 is at ON state, a current 150 may flow between the source area 105 and the channel area 103 through the first portion 151 and the second portion 153. Similarly, when the III-V MOSFET 100 is at ON state, a current 170 may flow between the drain area 107 and the channel area 103 through the first portion 171 and the second portion 173.

Figure 2:
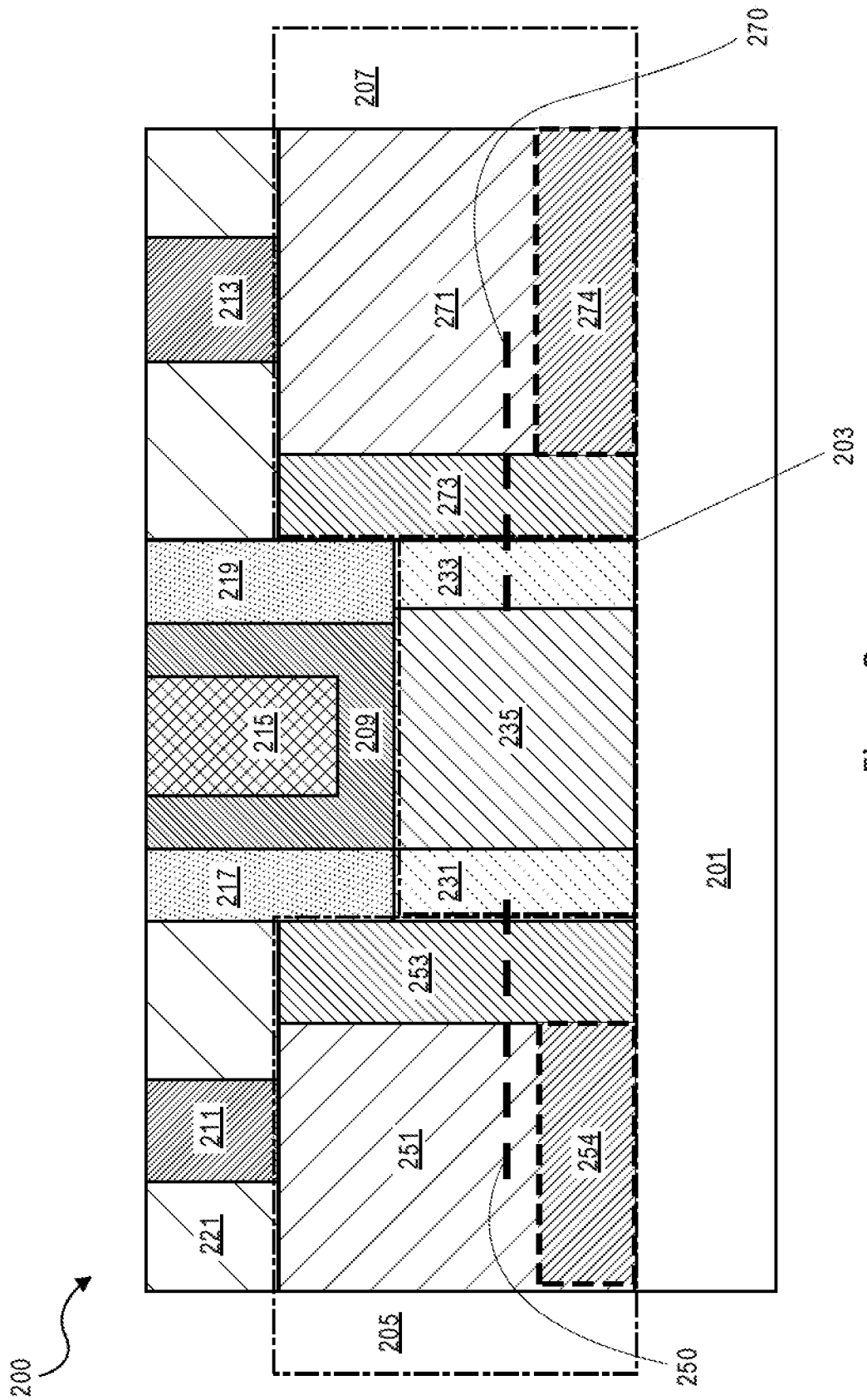
FIG. 2 schematically illustrates another example III-V MOSFET including a source area with multiple portions, where a bandgap of a channel material and bandgaps of the multiple portions of the source area form a monotonic sequence of bandgaps, in accordance with some embodiments.

In embodiments, the channel area 103 includes a channel III-V material. The channel area 103 may be a FinFET channel, a nanowire channel, a nanotube channel, or a nanoribbon channel. In particular, the channel III-V material may be included in the interface 131 or the interface 133. In some embodiments, the channel area 103 may include the channel III-V material only, as shown in FIG. 1. In some other embodiments, the channel area 103 may include multiple III-V materials, e.g., an additional III-V material as shown in FIG. 2.

In embodiments, the source area 105 includes the first portion 151, and the second portion 153. The second portion 153 is adjacent to the interface 131, while the first portion 151 is separated from the interface 131 by the second portion 153. The first portion 151 includes a first III-V material, and the second portion 153 includes a second III-V material. Similarly, the drain area 107 includes the first portion 171, and the second portion 173. The second portion 173 is adjacent to the interface 133, while the first portion 171 is separated from the interface 133 by the second portion 173. The first portion 171 includes the first III-V material, and the second portion 173 includes the second III-V material. In addition, the source area 105, e.g., the first portion 151 or the drain area 107, e.g., the first portion 171, may include dopant, e.g., an n-type dopant.

The first III-V material, the second III-V material, and the channel III-V material may include indium (In), phosphorus (P), gallium (Ga), or arsenic (As). There may be a large conduction band offset (CBO) between the first III-V material included in the first portion 151 of the source area 105 and the channel III-V material included in the channel area 103 or the interface 131. Similarly, a large CBO may exist between the first III-V material included in the first portion 171 of the source area 107 and the channel III-V material included in the channel area 103 or the interface 133. For example, when the first III-V material includes InGaAs in the first portion 151 of the source area 105 and the channel III-V material includes InP in the channel area 103 or the interface 133, there may be a CBO of 0.25 eV between InGaAs included in the first portion 151 and InP included in the interface 131. In addition, when the first III-V material includes InAs, and the channel III-V material includes InP, there may be a CBO of 0.45 eV between InAs included in the source area 105 and InP included in the interface 131. A large CBO between the channel III-V material included in the interface 131 and the first III-V material included in the source area 105 may cause a current choke for the source-channel junction including the source area 105 and the channel area 103. A large current choke for the source-channel junction may lead to large resistance between the source area 105 and the channel area 103. The second portion 153 between the first portion 151 and the interface 131 may be used to smooth the current choke for the source-channel junction including the source area 105 and the channel area 103 and to improve the performance for the III-V MOSFET 100. Similarly, the second portion 173 between the first portion 171 and the interface 133 may smooth the current choke for the drain-channel junction including the drain area 107 and the channel area 103.

In embodiments, the first III-V material, the second III-V material, and the channel III-V material may have a same lattice constant. Moreover, the channel III-V material has a channel material bandgap, the first III-V material has a first bandgap, the second III-V material has a second bandgap, where the channel material bandgap, the second bandgap, and the first bandgap may form a monotonic sequence of bandgaps. For example, the channel material bandgap is larger than the second bandgap, and the second bandgap is larger than the first bandgap. In some embodiments, the channel material bandgap is larger than the second bandgap by a first difference, and the second bandgap is larger than the first bandgap by a second difference substantially equal to the first difference.

In embodiments, the second portion 153 and the second portion 173 may include a vertical part in parallel with a sidewall of the channel area 103. In some embodiments, the second portion 153 and the second portion 173 may be adjacent to the sidewall of the channel area 103, as shown in FIG. 1. Different configurations for the second portion 153 and the second portion 173 may be shown in FIG. 2 or FIG. 3.

In some embodiments, the high-k gate dielectric layer 109 may include a high-k dielectric material. For example, the high-k gate dielectric layer 109 may include a material with a dielectric constant of at least about 10. In detail, the high-k gate dielectric layer 109 may include $Al_2O_3$, although other materials such as $La_2O_3$, $HfO_2$, $ZrO_2$, or ternary complexes such as $LaAl_xO_y$, $Hf_xZr_yO_z$ may be used in other embodiments.

In embodiments, the source electrode 111, the drain electrode 113, or the gate electrode 115 may be formed as a single layer or a stacked layer using one or more conductive films including a conductive material. For example, the source electrode 111, the drain electrode 113, or the gate electrode 115 may include a metallic material, a conductive polymer, a polysilicon, a titanium silicide, a phosphorus (n+) doped Si, a boron doped SiGe, or an alloy of a semiconductor material and a metal. For example, the source electrode 111, the drain electrode 113, or the gate electrode 115 may include gold (Au), platinum (Pt), ruthenium (Ru), iridium (Ir), titanium (Ti), aluminum (Al), molybdenum (Mo), copper (Cu), tantalum (Ta), tungsten (W), nickel (Ni), chromium (Cr), hafnium (Hf), indium (In), or an alloy of Ti, Mo, Au, Pt, Al Ni, Cu, Cr, TiAlN, HfAlN, or InAlO. The source electrode 111, the drain electrode 113, or the gate electrode 115 may include tantalum nitride (TaN), titanium nitride (TiN), iridium-tantalum alloy (Ir—Ta), indium-tin oxide (ITO), the like, and/or a combination thereof.

In embodiments, the substrate 101 may be a silicon substrate, a glass substrate, such as soda lime glass or borosilicate glass, a metal substrate, a plastic substrate, a polyimide substrate, or other suitable substrate. The substrate 101 may include silicon, sapphire, SiC, GaN, or AlN. The substrate includes a high-resistivity p-type or n-type vicinal silicon material, germanium, germanium on silicon, gallium arsenide (GaAs), or a silicon-on-insulator substrate.

FIG. 2 schematically illustrates another example III-V MOSFET 200 including a source area 205 with multiple portions, e.g., a first portion 251, and a second portion 253, where a bandgap of a channel material and bandgaps of the multiple portions of the source area form a monotonic sequence of bandgaps, in accordance with some embodiments. In embodiments, the III-V MOSFET 200, the source area 205, the first portion 251, and the second portion 253, may be similar to the III-V MOSFET 100, the source area 105, the first portion 151, and the second portion 153, respectively, as shown in FIG. 1.

In embodiments, the III-V MOSFET 200 may include a substrate 201. A channel area 203 may be above the substrate 201, where the channel area 203 may include an inner channel area 235, an interface area 231 and an interface area 233 adjacent to the inner channel area 235. The interface area 231 may be an interface between the channel area 203 and the source 205, while the interface area 233 may be an interface between the channel area 203 and a drain area 207, where both the interface area 231 and the interface area 233 may be outer areas of the channel 203. The interface area 231 and the interface area 233 may include a channel III-V material, while the inner channel area 235 includes an inner channel III-V material different from the channel III-V material in the interface area 231 and the interface area 233.

The source area 205 including the first portion 251, and the second portion 253 may be above the substrate 201 and adjacent to the channel area 203 with the interface 231. The second portion 253 includes a vertical part in parallel with a sidewall of the channel area 203, and a horizontal part 254 in parallel to a surface of the substrate 201. A source electrode 211 may be coupled to the source area 205 at the first portion 251. The drain area 207 is above the substrate 201 and adjacent to the channel area 203 with the interface 233. The drain area 207 may include a first portion 271, and a second portion 273. A drain electrode 213 may be coupled to the drain area 207 at the first portion 271. The second portion 273 includes a vertical part in parallel with a sidewall of the channel area 203, and a horizontal part 274 in parallel to a surface of the substrate 201. A high-k gate dielectric layer 209 may be on the channel area 203. A gate electrode 215 may be separated from the channel area 203 by the high-k gate dielectric layer 209. A spacer 217 may be between the source electrode 211 and the gate electrode 215, and a spacer 219 may be between the drain electrode 213 and the gate electrode 215. Furthermore, the source electrode 211, the drain electrode 213, and the gate electrode 215 may be within an ILD layer 221. When the III-V MOSFET 200 is at ON state, a current 250 may flow between the source area 205 and the channel area 203 through the first portion 251 and the second portion 253. Similarly, when the III-V MOSFET 200 is at ON state, a current 270 may flow between the drain area 207 and the channel area 203 through the first portion 271 and the second portion 273.

In embodiments, the source area 205 includes the first portion 251, and the second portion 253. The second portion 253 is adjacent to the interface 231, while the first portion 251 is separated from the interface 231 by the second portion 253. The first portion 251 includes a first III-V material, and the second portion 253 includes a second III-V material. Similarly, the drain area 207 includes the first portion 271, and the second portion 273. The second portion 273 is adjacent to the interface 233, while the first portion 271 is separated from the interface 233 by the second portion 273. The first portion 271 includes the first III-V material, and the second portion 273 includes the second III-V material. In addition, the source area 205, e.g., the first portion 251 or the drain area 207, e.g., the first portion 271, may include dopant, e.g., an n-type dopant.

In embodiments, the first III-V material, the second III-V material, and the channel III-V material may have a same lattice constant. Moreover, the channel III-V material has a channel material bandgap, the first III-V material has a first bandgap, the second III-V material has a second bandgap, where the channel material bandgap, the second bandgap, and the first bandgap may form a monotonic sequence of bandgaps. For example, the channel material bandgap is larger than the second bandgap, and the second bandgap is larger than the first bandgap. In some embodiments, the channel material bandgap is larger than the second bandgap by a first difference, and the second bandgap is larger than the first bandgap by a second difference substantially equal to the first difference.

Figures 3A, 3B:
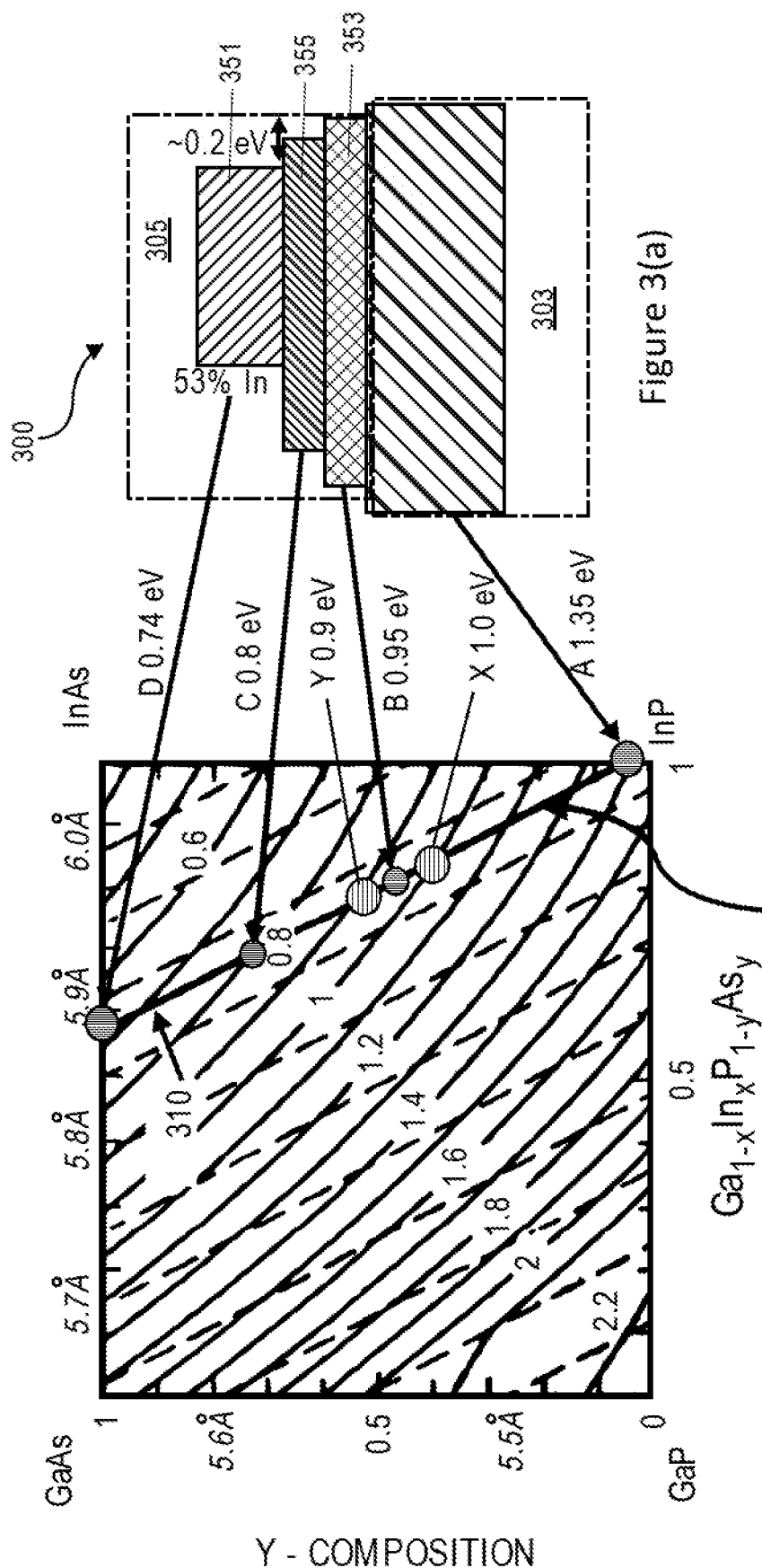
FIGS. 3(a)-3(b) schematically illustrate a source-channel junction, where a source area includes multiple portions, where a bandgap of a channel material and bandgaps of the multiple portions of the source area form a monotonic sequence of bandgaps, in accordance with some embodiments.

FIGS. 3(a)-3(b) schematically illustrate a source-channel junction 300, where a source area 305 includes multiple portions, e.g., a first portion 351, a second portion 353, and a third portion 355, where a bandgap of a channel material and bandgaps of the multiple portions of the source area form a monotonic sequence of bandgaps, in accordance with some embodiments. In embodiments, the source-channel junction 300 may include the source area 305 and a channel area 303. The source-channel junction 300 may be a part of the III-V MOSFET 200, where the source area 305, the first portion 351, the second portion 353, and the channel area 303 may be similar to the source area 205, the first portion 251, the second portion 253, and the channel area 203, respectively, as shown in FIG. 2. Similarly, the source-channel junction 300 may be a part of the III-V MOSFET 100, where the source area 305, the first portion 351, the second portion 353, and the channel area 303 may be similar to the source area 105, the first portion 151, the second portion 153, and the channel area 103, respectively, as shown in FIG. 1.

In embodiments, the source area 305 may include the first portion 351, and the second portion 353. In addition, multiple portions of the source area may exist between the first portion 351 and the second portion 353. For example, the third portion 355 may exist between the first portion 351 and the second portion 353. In some other embodiments, there may be more than the third portion 355 between the first portion 351 and the second portion 353. As shown, the channel area 303, the second portion 353 of the source area 305, the third portion 355 between the first portion 351 of the source area 305 and the second portion 353 of the source area 305, and the first portion 351 of the source area 305 together form a staircase shape. A length of the channel area 303 may be longer than a length of the second portion 353. Similarly, the length of the second portion 353 may be longer than a length of the third portion 355. Moreover, the length of the third portion 355 may be longer than a length of the first portion 351.

In embodiments, the first portion 351 includes a first III-V material, the second portion 353 includes a second III-V material, the third portion 355 includes a third III-V material, and the channel area 303 includes a channel III-V material. The first III-V material, the second III-V material, the third III-V material, and the channel III-V material may have a same lattice constant.

In embodiments, the channel III-V material has a channel material bandgap, the first III-V material has a first bandgap, the second III-V material has a second bandgap, and the third III-V material has a third bandgap. According to the physical positions of the channel area 303, the second portion 353, the third portion 355, and the first portion 351, the channel material bandgap, the second bandgap, the third bandgap, and the first bandgap may form a monotonic sequence of bandgaps. For example, the channel material bandgap is larger than the second bandgap, the second bandgap is larger than the third bandgap, and the third bandgap is larger than the first bandgap. In some embodiments, the difference between two adjacent bandgaps in the sequence of the bandgaps may be substantially equal.

For example, the channel III-V material in the channel area 303 includes InP, the first III-V material in the first portion 351 includes InGaAs. The second III-V material in the second portion 353 and the third portion 355 may include $In_xGa_{1-x}As_yP_{1-y}$. As one example, the channel III-V material in the channel area 303, the first III-V material in the first portion 351, the second III-V material in the second portion 353, and the third portion 355, may include compound compositions of GaAs, InAs, GaP, or InP, selected from a curve 310 of lattice constant of 5.86 Å as shown in FIG. 3(b). In detail, the channel III-V material may include InP with a bandgap of 1.35 eV, corresponding to a point A marked in the curve 310. The first III-V material may include $In_{0.53}Ga_{0.47}As$ with a first bandgap as 0.74 eV, corresponding to a point D marked in the curve 310. In addition, the second III-V material may include $In_{x1}Ga_{1-x1}As_{y1}P_{1-y1}$ with a second bandgap as 0.95 eV, corresponding to a point B marked in the curve 310. Furthermore, the third III-V material may include $In_{x2}Ga_{1-x2}As_{y2}P_{1-y2}$ with a third bandgap as 0.8 eV, corresponding to a point C marked in the curve 310. The bandgap of a channel material for the channel area 303 and bandgaps of the multiple portions of the source area 305, e.g., the bandgaps of the point A, B, C, and D, form a monotonic sequence of bandgaps, so that the differences between any two adjacent bandgaps are smaller than the initial bandgap difference between the bandgap of the channel material and the bandgap of the first III-V material. The selection of multiple III-V materials for the multiple portions of the source area to reduce the bandgap difference between any two adjacent III-V materials may be referred to as to grade the channel III-V material to the first III-V material.

In embodiments, to reduce a conduction band discontinuity of a source-channel junction between a source area with InGaAs and a channel area with InP, a sequence of III-V materials with various composition of InGaAsP may be selected along a lattice constant, bandgap, and III-V material composition curve so that the chosen materials may have a same lattice constant, while forming a monotonic sequence of bandgaps. There may be more than three portions of the source area, e.g., the first portion 351, the second portion 353, and the third portion 355. When there are multiple portions of the source area 305 with multiple III-V materials, the selection of an III-V material for a portion of the multiple portions may correspond to a monotonic location of a lattice constant, bandgap, and III-V material composition curve. As a result, the III-V MOSFET may have reduced source/drain resistance and improved performance. For example, instead of selecting the second III-V material including $In_{x1}Ga_{1-x1}As_{y1}P_{1-y1}$ with a second bandgap as 0.95 eV corresponding to the point B marked in the curve 310, the second III-V material may select a composition of $In_{x3}Ga_{1-x3}As_{y3}P_{1-y3}$ corresponding to a point X with a bandgap of 1.0 eV, or select a composition of $In_{x4}Ga_{1-x4}As_{y4}P_{1-y4}$ corresponding to a point Y with a bandgap of 0.8 eV.

Figure 4:
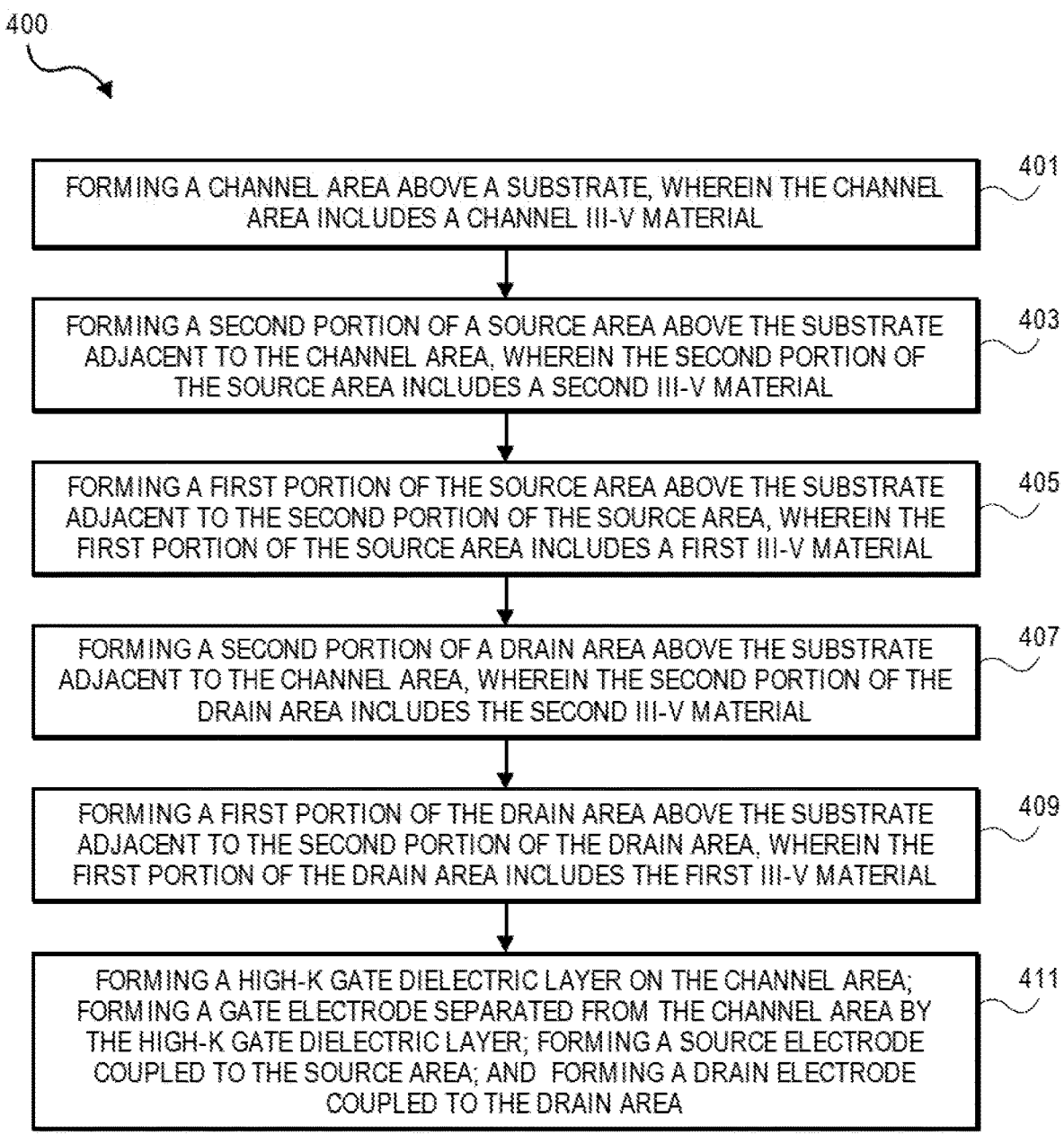
FIG. 4 schematically illustrates an example process for forming an III-V MOSFET including a source area with multiple portions, where a bandgap of a channel material and bandgaps of the multiple portions of the source area form a monotonic sequence of bandgaps, in accordance with some embodiments.

FIG. 4 schematically illustrates an example process 400 for forming an III-V MOSFET including a source area with multiple portions, where a bandgap of a channel material and bandgaps of the multiple portions of the source area form a monotonic sequence of bandgaps, in accordance with some embodiments. In embodiments, the process 400 may be used to form the III-V MOSFET 100, or the III-V MOSFET 200, which may include a source-channel junction similar to the source-channel junction 300, as shown in FIGS. 1-3.

At block 401, the process 400 may include forming a channel area above a substrate, wherein the channel area includes a channel III-V material. For example, as shown in FIG. 1, the process 400 may include forming the channel area 103 above the substrate 101, where the channel area 103 includes a channel III-V material.

At block 403, the process 400 may include forming a second portion of a source area above the substrate adjacent to the channel area, wherein the second portion of the source area includes a second III-V material. For example, as shown in FIG. 1, the process 400 may include forming the second portion 153 of the source area 105 above the substrate 101 adjacent to the channel area 103, wherein the second portion 153 of the source area 105 includes a second III-V material.

At block 405, the process 400 may include forming a first portion of the source area above the substrate adjacent to the second portion of the source area, wherein the first portion of the source area includes a first III-V material. For example, as shown in FIG. 1, the process 400 may include forming the first portion 151 of the source area 105 above the substrate 101 adjacent to the second portion 153 of the source area 105. The first portion 151 of the source area 105 includes a first III-V material. In embodiments, the channel III-V material in the channel area 103 has a channel material bandgap and a lattice constant. The first III-V material and the second III-V material have a same lattice constant as the channel III-V material in the channel area 103. Furthermore, the first III-V material has a first bandgap, and the second III-V material has a second bandgap, where the channel material bandgap, the second bandgap, and the first bandgap may form a monotonic sequence of bandgaps.

At block 407, the process 400 may include forming a second portion of a drain area above the substrate adjacent to the channel area, wherein the second portion of the drain area includes the second III-V material. For example, as shown in FIG. 1, the process 400 may include forming the second portion 173 of the drain area 107 above the substrate 101 adjacent to the channel area 103, wherein the second portion 173 of the drain area 107 includes the second III-V material.

At block 409, the process 400 may include forming a first portion of the drain area above the substrate adjacent to the second portion of the drain area, wherein the first portion of the drain area includes the first III-V material. For example, as shown in FIG. 1, the process 400 may include forming the first portion 171 of the drain area 107 above the substrate 101 adjacent to the second portion 173 of the drain area 107, wherein the first portion 171 of the drain area 107 includes the first III-V material.

At block 411, the process 400 may include forming a high-k gate dielectric layer on the channel area; forming a gate electrode separated from the channel area by the high-k gate dielectric layer; forming a source electrode coupled to the source area; and forming a drain electrode coupled to the drain area. For example, as shown in FIG. 1, the process 400 may include forming the high-k gate dielectric layer 109 on the channel area 103; forming the gate electrode 115 separated from the channel area 103 by the high-k gate dielectric layer 109; forming the source electrode 111 coupled to the source area 105; and forming the drain electrode 113 coupled to the drain area 107.

Figure 5G:
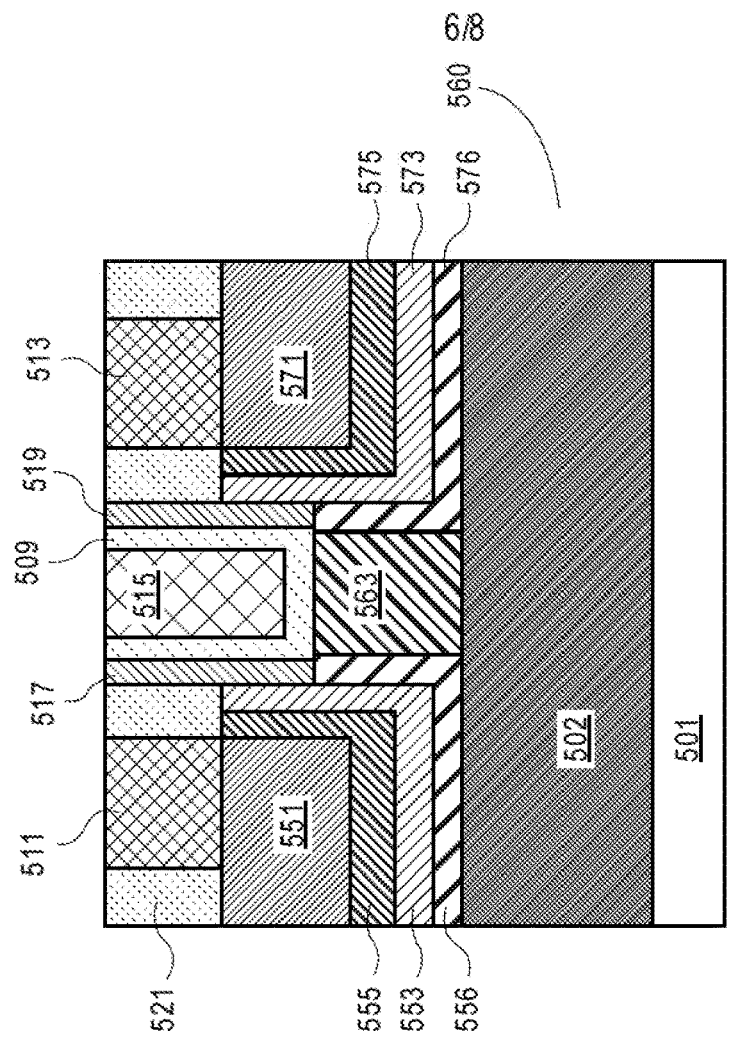
Figure 5F:
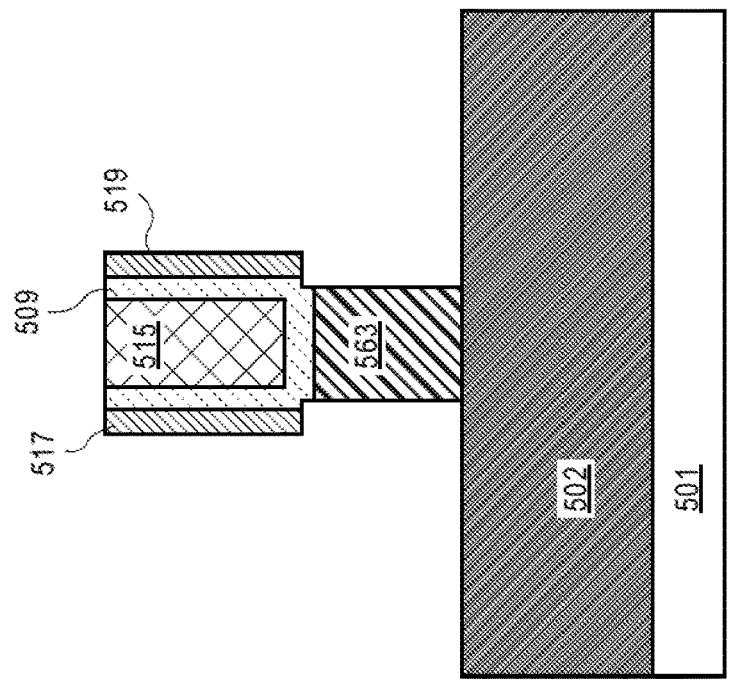

FIGS. 5(*a*)-5(*g*) schematically illustrate an example process 500 for forming an III-V MOSFET 550 or an III-V MOSFET 560 including a source area with multiple portions, e.g., a first portion 551, a second portion 553, and a third portion 555, where a bandgap of a channel material and bandgaps of the multiple portions of the source area form a monotonic sequence of bandgaps, in accordance with some embodiments. In embodiments, the III-V MOSFET 550 and the III-V MOSFET 560 may be similar to the III-V MOSFET 100, or the III-V MOSFET 200, which may include a source-channel junction similar to the source-channel junction 300, as shown in FIGS. 1-3.

As illustrated in FIG. 5(*a*), the process 500 may include forming a buffer layer 502 on a substrate 501, and forming a channel layer 503 on the buffer layer 502. In addition, the process 500 may form a dummy gate 508 on the channel layer 503, a spacer 517 and a spacer 519 around the dummy gate 508. For example, the substrate 501 may include silicon, the buffer layer 502 may include GaAs, the channel layer 503 may include InP, and the dummy gate 508 may include polysilicon.

As illustrated in FIG. 5(*b*), the process 500 may include patterning the channel layer 503 to form a channel area 503, based on the pattern of the spacer 517, the spacer 519 around the dummy gate 508.

As illustrated in FIG. 5(*c*), the process 500 may include forming a first portion 551, a second portion 553, and a third portion 555 for the source area. In addition, the process 500 may include forming a first portion 571, a second portion 573, and a third portion 575 for the drain area. The second portion 553 may be adjacent to the channel area 503, the third portion 555 may be adjacent to the second portion 553, and the first portion 551 may be adjacent to the third portion 555. The first portion 551, the second portion 553, and the third portion 555 may be similar to the first portion 351, the second portion 353, and the third portion 355 as shown in FIG. 3(*a*).

As illustrated in FIG. 5(*d*), the process 500 may include removing the dummy gate 508, forming a high-k gate dielectric layer 509 on the channel area 503, within the dummy gate area 508, forming a gate electrode 515 separated from the channel area 503 by the high-k gate dielectric layer 509, and further forming an ILD layer 521 covering the gate electrode 515, the spacer 517, and the spacer 519.

As illustrated in FIG. 5(*e*), the process 500 may include forming a source electrode 511 coupled to the first portion 551 of the source area, and forming a drain electrode 513 coupled to the first portion 571 of the drain area. The III-V MOSFET 550 may be formed after steps shown in FIG. 5(*e*) are performed. The III-V MOSFET 550 may be similar to the III-V MOSFET 100 in FIG. 1 or the III-V MOSFET 200 shown in FIG. 2.

As illustrated in FIG. 5(*f*), the process 500 may alternatively include patterning the channel layer 503 to form a channel area 563, based on the pattern of the spacer 517, the spacer 519 around the dummy gate 508. In some embodiments, the channel area 563 may be different from the channel area 503 shown in FIG. 5(*b*). The channel area 563 may not vertically overlap with the spacer 517 and the spacer 519, and is vertically under the dummy gate 508. After the channel area 563 is formed, the dummy gate 508 may be replaced by the gate electrode 515 and the high-k gate dielectric layer 509 over the channel area 563, where the gate electrode 515 is separated from the channel area 563 by the high-k gate dielectric layer 509.

As illustrated in FIG. 5(*g*), to follow the operations in FIG. 5(*f*), the process 500 may include forming a portion of the channel area 556 next to the channel area 563, and a portion of the channel area 576 next to the channel area 563. The portion of the channel area 556 and the portion of the channel area 576 may include a material different from a material for the channel area 563. Furthermore, the process 500 may include forming the first portion 551, the second portion 553, and the third portion 555 for the source area. In addition, the process 500 may include forming the first portion 571, the second portion 573, and the third portion 575 for the drain area. The second portion 553 may be adjacent to the channel area 556, the third portion 555 may be adjacent to the second portion 553, and the first portion 551 may be adjacent to the third portion 555. The first portion 551, the second portion 553, and the third portion 555 may be similar to the first portion 351, the second portion 353, and the third portion 355 as shown in FIG. 3(*a*). The process 500 may further include forming the source electrode 511 coupled to the first portion 551 of the source area, and forming the drain electrode 513 coupled to the first portion 571 of the drain area. The III-V MOSFET 560 may be formed after steps shown in FIG. 5(*g*) are performed. The III-V MOSFET 560 may be similar to the III-V MOSFET 100 in FIG. 1 or the III-V MOSFET 200 shown in FIG. 2. In embodiments, a bandgap of a channel material for the channel area 563, a bandgap of a channel material for the channel area 556, and bandgaps of the multiple portions of the source area, e.g., the first portion 551, the second portion 553, and the third portion 555, may form a monotonic sequence of bandgaps.

Figure 6:
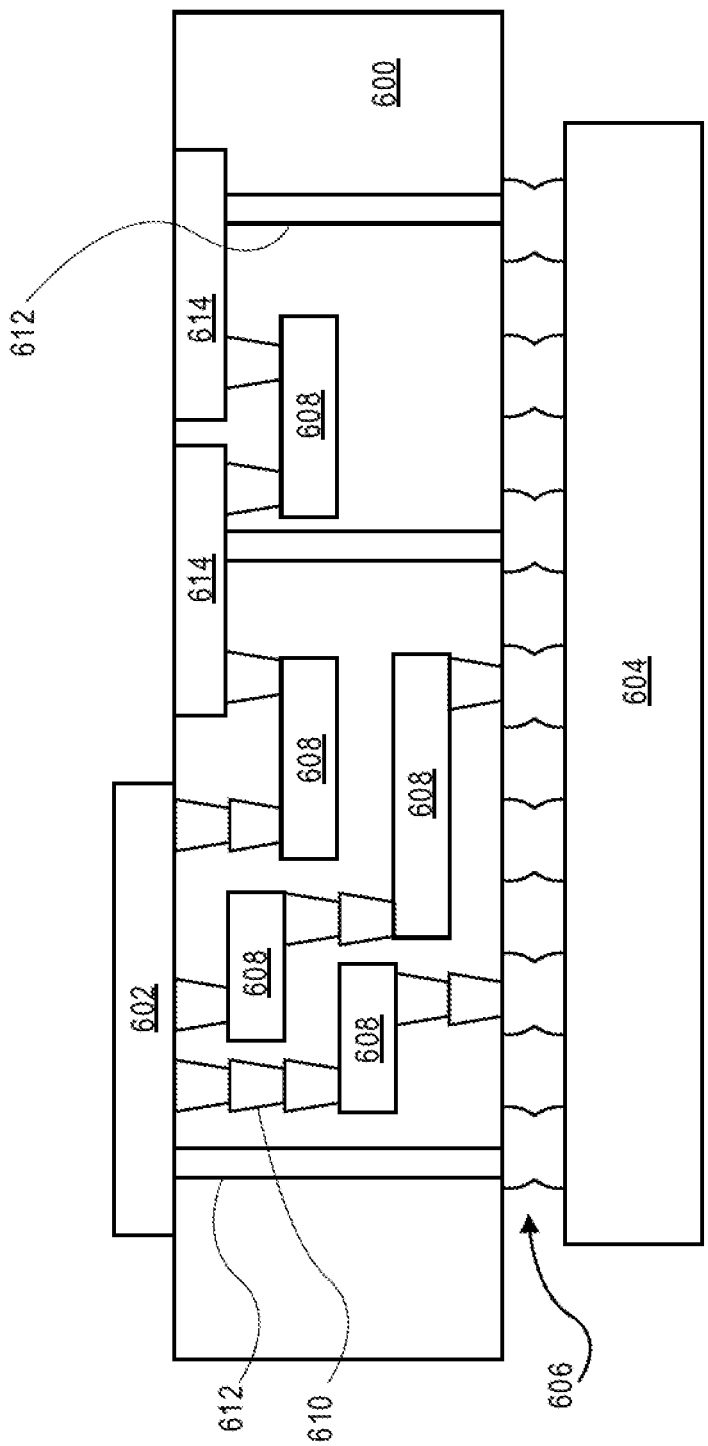
FIG. 6 schematically illustrates an interposer implementing one or more embodiments of the disclosure, in accordance with some embodiments.

FIG. 6 illustrates an interposer 600 that includes one or more embodiments of the disclosure. The interposer 600 is an intervening substrate used to bridge a first substrate 602 to a second substrate 604. The first substrate 602 may be, for instance, a substrate support the III-V MOSFET 100 shown in FIG. 1, the III-V MOSFET 200 shown in FIG. 2, the source-channel junction 300 shown in FIG. 3, the III-V MOSFET 550 shown in FIG. 5(e), or the III-V MOSFET 560 shown in FIG. 5(g). The second substrate 604 may be, for instance, a memory module, a computer motherboard, or another integrated circuit die. Generally, the purpose of an interposer 600 is to spread a connection to a wider pitch or to reroute a connection to a different connection. For example, an interposer 600 may couple an integrated circuit die to a ball grid array (BGA) 606 that can subsequently be coupled to the second substrate 604. In some embodiments, the first and second substrates 602/604 are attached to opposing sides of the interposer 600. In other embodiments, the first and second substrates 602/604 are attached to the same side of the interposer 600. And in further embodiments, three or more substrates are interconnected by way of the interposer 600.

The interposer 600 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 608 and vias 610, including but not limited to through-silicon vias (TSVs) 612. The interposer 600 may further include embedded devices 614, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 600.

In accordance with embodiments of the disclosure, apparatuses or processes disclosed herein may be used in the fabrication of interposer 600.

Figure 7:
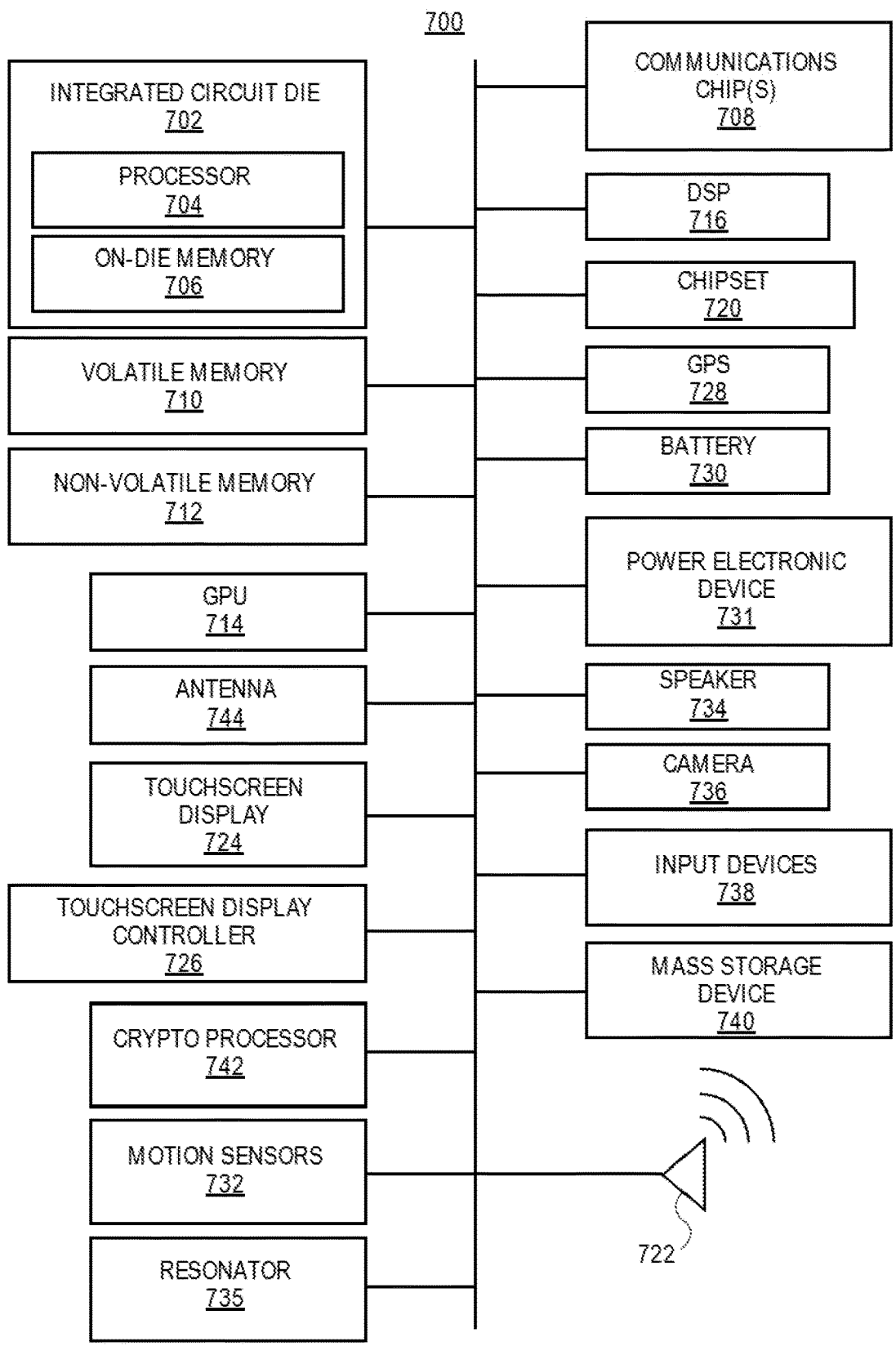
FIG. 7 schematically illustrates a computing device built in accordance with an embodiment of the disclosure, in accordance with some embodiments.

FIG. 7 illustrates a computing device 700 in accordance with one embodiment of the disclosure. The computing device 700 may include a number of components. In one embodiment, these components are attached to one or more motherboards. In an alternate embodiment, some or all of these components are fabricated onto a single system-on-a-chip (SoC) die, such as a SoC used for mobile devices. The components in the computing device 700 include, but are not limited to, an integrated circuit die 702 and at least one communications logic unit 708. In some implementations the communications logic unit 708 is fabricated within the integrated circuit die 702 while in other implementations the communications logic unit 708 is fabricated in a separate integrated circuit chip that may be bonded to a substrate or motherboard that is shared with or electronically coupled to the integrated circuit die 702. The integrated circuit die 702 may include a processor 704 as well as on-die memory 706, often used as cache memory, which can be provided by technologies such as embedded DRAM (eDRAM), or SRAM. For example, the processor 704 or the on-die memory 706, or other control circuits in the integrated circuit die 702 may include the III-V MOSFET 100 shown in FIG. 1, the III-V MOSFET 200 shown in FIG. 2, the source-channel junction 300 shown in FIG. 3, the III-V MOSFET 550 shown in FIG. 5(e), the III-V MOSFET 560 shown in FIG. 5(g), or an III-V MOSFET fabricated following the process 400 shown in FIG. 4.

In embodiments, the computing device 700 may include a display or a touchscreen display 724, and a touchscreen display controller 726. A display or the touchscreen display 724 may include a FPD, an AMOLED display, a TFT LCD, a micro light-emitting diode (LED) display, or others.

Computing device 700 may include other components that may or may not be physically and electrically coupled to the motherboard or fabricated within a SoC die. These other components include, but are not limited to, volatile memory 710 (e.g., dynamic random access memory (DRAM), non-volatile memory 712 (e.g., ROM or flash memory), a graphics processing unit 714 (GPU), a digital signal processor (DSP) 716, a crypto processor 742 (e.g., a specialized processor that executes cryptographic algorithms within hardware), a chipset 720, at least one antenna 722 (in some implementations two or more antenna may be used, e.g., an antenna 744), a battery 730 or other power source, a power electronic device 731, a voltage regulator (not shown), a global positioning system (GPS) device 728, a compass, a motion coprocessor or sensors 732 (that may include an accelerometer, a gyroscope, and a compass), a microphone (not shown), a speaker 734, a resonator 735, a camera 736, user input devices 738 (such as a keyboard, mouse, stylus, and touchpad), and a mass storage device 740 (such as hard disk drive, compact disk (CD), digital versatile disk (DVD), and so forth). In embodiments, various components may include the III-V MOSFET 100 shown in FIG. 1, the III-V MOSFET 200 shown in FIG. 2, the source-channel junction 300 shown in FIG. 3, the III-V MOSFET 550 shown in FIG. 5(e), the III-V MOSFET 560 shown in FIG. 5(g), or an III-V MOSFET fabricated following the process 400 shown in FIG. 4.

The computing device 700 may incorporate further transmission, telecommunication, or radio functionality not already described herein. In some implementations, the computing device 700 includes a radio that is used to communicate over a distance by modulating and radiating electromagnetic waves in air or space. In further implementations, the computing device 700 includes a transmitter and a receiver (or a transceiver) that is used to communicate over a distance by modulating and radiating electromagnetic waves in air or space.

The communications logic unit 708 enables wireless communications for the transfer of data to and from the computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communications logic unit 708 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Infrared (IR), Near Field Communication (NFC), Bluetooth, derivatives thereof, as well as any other wireless protocols that are designated as 3G, 4G, 5G, and beyond. The computing device 700 may include a plurality of communications logic units 708. For instance, a first communications logic unit 708 may be dedicated to shorter range wireless communications such as Wi-Fi, NFC, and Bluetooth and a second communications logic unit 708 may be dedicated to longer range wireless communications such as GPS, EDGE, GPRS, CDMA, WiMAX, LTE, Ev-DO, and others.

The processor 704 of the computing device 700 includes one or more devices, such as transistors. The term "processor" may refer to any device or portion of a device that processes electronic data from registers and/or memory to transform that electronic data into other electronic data that may be stored in registers and/or memory. The communications logic unit 708 may also include one or more devices, such as transistors.

In further embodiments, another component housed within the computing device 700 may contain one or more devices, such as the power electronic device 731, that are formed in accordance with implementations of the current disclosure, e.g., the III-V MOSFET 100 shown in FIG. 1, the III-V MOSFET 200 shown in FIG. 2, the source-channel junction 300 shown in FIG. 3, the III-V MOSFET 550 shown in FIG. 5(e), the III-V MOSFET 560 shown in FIG. 5(g), or an III-V MOSFET fabricated following the process 400 shown in FIG. 4.

In various embodiments, the computing device 700 may be a laptop computer, a netbook computer, a notebook computer, an ultrabook computer, a smartphone, a dumbphone, a tablet, a tablet/laptop hybrid, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 700 may be any other electronic device that processes data.

Some non-limiting Examples are provided below.

Example 1 may include a semiconductor device, comprising: a substrate; a channel area above the substrate and including a channel III-V material; and a source area above the substrate including a first portion and a second portion of the source area, wherein an interface between the channel area and the source area includes the channel III-V material, the second portion of the source area is adjacent to the interface between the channel area and the source area, the first portion of the source area is separated from the interface between the channel area and the source area by the second portion of the source area, the first portion of the source area includes a first III-V material, and the second portion of the source area includes a second III-V material, and wherein the channel III-V material has a channel material bandgap and a lattice constant, the first III-V material has a first bandgap and the lattice constant, the second III-V material has a second bandgap and the lattice constant, and the channel material bandgap, the second bandgap, and the first bandgap form a monotonic sequence of bandgaps.

Example 2 may include the semiconductor device of example 1 and/or some other examples herein, wherein the source area further includes a sequence of multiple portions between the first portion of the source area and the second portion of the source area, a portion of the multiple portions includes an III-V material with a bandgap of the portion and the lattice constant, and the channel material bandgap, the second bandgap, the bandgap of the portion for the portion of the multiple portions, and the first bandgap form a monotonic sequence of bandgaps.

Example 3 may include the semiconductor device of example 2 and/or some other examples herein, wherein the channel area, the second portion of the source area, the multiple portions between the first portion of the source area and the second portion of the source area, and the first portion of the source area together form a staircase shape.

Example 4 may include the semiconductor device of example 1 and/or some other examples herein, wherein the channel material bandgap is larger than the second bandgap, and the second bandgap is larger than the first bandgap.

Example 5 may include the semiconductor device of example 4 and/or some other examples herein, wherein the channel material bandgap is larger than the second bandgap by a first difference, and the second bandgap is larger than the first bandgap by a second difference substantially equal to the first difference.

Example 6 may include the semiconductor device of example 1 and/or some other examples herein, wherein the second portion of the source area includes a vertical part in parallel with a sidewall of the channel area.

Example 7 may include the semiconductor device of example 6 and/or some other examples herein, wherein the second portion of the source area further includes a horizontal part in parallel to a surface of the substrate.

Example 8 may include the semiconductor device of example 1 and/or some other examples herein, further comprising: a source electrode coupled to the source area; a drain area above the substrate including a first portion and a second portion of the drain area, wherein an interface between the channel area and the drain area includes the channel III-V material, the second portion of the drain area is adjacent to the interface between the channel area and the drain area, the first portion of the drain area is separated from the interface between the channel area and the drain area by the second portion of the drain area, the first portion of the drain area includes the first III-V material, and the second portion of the drain area includes the second III-V material; a drain electrode coupled to the drain area; a high-k gate dielectric layer on the channel area; and a gate electrode separated from the channel area by the high-k gate dielectric layer.

Example 9 may include the semiconductor device of example 1 and/or some other examples herein, wherein the channel area includes the interface between the channel area and the source area as an outer area of the channel area, and an inner channel area adjacent to the interface, and the inner channel area includes an inner channel III-V material different from the channel III-V material in the interface.

Example 10 may include the semiconductor device of example 1 and/or some other examples herein, wherein the channel area includes a channel selected from the group consisting of a FinFET channel, a nanowire channel, a nanotube channel, and a nanoribbon channel.

Example 11 may include the semiconductor device of example 1 and/or some other examples herein, wherein the channel III-V material, the first III-V material, or the second III-V material includes a material selected from the group consisting of indium (In), phosphorus (P), gallium (Ga), and arsenic (As).

Example 12 may include the semiconductor device of example 1 and/or some other examples herein, wherein the channel III-V material includes InP, the first III-V material includes InGaAs, and the second III-V material includes $In_xGa_{1-x}As_yP_{1-y}$.

Example 13 may include the semiconductor device of example 1 and/or some other examples herein, wherein the substrate includes a material selected from the group consisting of a high-resistivity p-type or n-type vicinal silicon material, germanium, germanium on silicon, gallium arsenide (GaAs), and a silicon-on-insulator substrate.

Example 14 may include the semiconductor device of example 1 and/or some other examples herein, wherein the first portion or the second portion of the source area includes n-type dopant.

Example 15 may include a method for forming a semiconductor device, the method comprising: forming a channel area above a substrate, wherein the channel area includes a channel III-V material; forming a second portion of a source area above the substrate adjacent to the channel area, wherein the second portion of the source area includes a second III-V material; and forming a first portion of the source area above the substrate adjacent to the second portion of the source area, wherein the first portion of the source area includes a first III-V material; wherein the channel III-V material has a channel material bandgap and a lattice constant, the first III-V material has a first bandgap and the lattice constant, the second III-V material has a second bandgap and the lattice constant, and the channel material bandgap, the second bandgap, and the first bandgap form a monotonic sequence of bandgaps.

Example 16 may include the method of example 15 and/or some other examples herein, wherein the second portion of the source area includes a vertical part in parallel with a sidewall of the channel area, and a horizontal part in parallel to a surface of the substrate.

Example 17 may include the method of example 15 and/or some other examples herein, further comprising: forming a second portion of a drain area above the substrate adjacent to the channel area, wherein the second portion of the drain area includes the second III-V material; and forming a first portion of the drain area above the substrate adjacent to the second portion of the drain area, wherein the first portion of the drain area includes the first III-V material;

Example 18 may include the method of example 17 and/or some other examples herein, further comprising: forming a high-k gate dielectric layer on the channel area; forming a gate electrode separated from the channel area by the high-k gate dielectric layer; forming a source electrode coupled to the source area; and forming a drain electrode coupled to the drain area.

Example 19 may include the method of example 15 and/or some other examples herein, further comprising: forming a sequence of multiple portions of the source area between the first portion of the source area and the second portion of the source area, a portion of the multiple portions includes an III-V material with a bandgap of the portion and the lattice constant, and the channel material bandgap, the second bandgap, the bandgap of the portion for the portion of the multiple portions, and the first bandgap form a monotonic sequence of bandgaps.

Example 20 may include the method of example 15 and/or some other examples herein, wherein the channel material bandgap is larger than the second bandgap by a first difference, and the second bandgap is larger than the first bandgap by a second difference substantially equal to the first difference.

Example 21 may include the method of example 15 and/or some other examples herein, wherein the lattice constant is 5.86 A, the channel III-V material includes InP, the channel material bandgap is 1.35 eV, the first III-V material includes $In_{0.53}Ga_{0.47}As$, the first bandgap is 0.74 eV, the second III-V material includes $In_xGa_{1-x}As_yP_{1-y}$, the second bandgap is 0.95 eV.

Example 22 may include a computing device, comprising: a processor; and a memory device coupled to the processor, wherein the memory device or the processor includes a transistor comprising: a substrate; a channel area above the substrate and including a channel III-V material; and a source area above the substrate including a first portion and a second portion of the source area, wherein an interface between the channel area and the source area includes the channel III-V material, the second portion of the source area is adjacent to the interface between the channel area and the source area, the first portion of the source area is separated from the interface between the channel area and the source area by the second portion of the source area, the first portion of the source area includes a first III-V material, and the second portion of the source area includes a second III-V material, and wherein the channel III-V material has a channel material bandgap and a lattice constant, the first III-V material has a first bandgap and the lattice constant, the second III-V material has a second bandgap and the lattice constant, and the channel material bandgap, the second bandgap, and the first bandgap form a monotonic sequence of bandgaps.

Example 23 may include the computing device of example 22 and/or some other examples herein, wherein the source area further includes a sequence of multiple portions between the first portion of the source area and the second portion of the source area, a portion of the multiple portions includes an III-V material with a bandgap of the portion and the lattice constant, and the channel material bandgap, the second bandgap, the bandgap of the portion for the portion of the multiple portions, and the first bandgap form a monotonic sequence of bandgaps.

Example 24 may include the computing device of example 22 and/or some other examples herein, wherein the lattice constant is 5.86 A, the channel III-V material includes InP, the channel material bandgap is 1.35 eV, the first III-V material includes $In_{0.53}Ga_{0.47}As$, the first bandgap is 0.74 eV, the second III-V material includes $In_xGa_{1-x}As_yP_{1-y}$, the second bandgap is 0.95 eV.

Example 25 may include the computing device of example 22 and/or some other examples herein, wherein the computing device is a wearable device or a mobile computing device, the wearable device or the mobile computing device including one or more selected from the group consisting of an antenna, a touchscreen controller, a battery, an audio codec, a video codec, a power amplifier, a global positioning system (GPS) device, a compass, a Geiger counter, an accelerometer, a gyroscope, a speaker, and a camera coupled with the processor.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description.

The terms used in the following claims should not be construed to limit various embodiments of the present disclosure to the specific implementations disclosed in the specification and the claims. Rather, the scope is to be determined entirely by the following claims, which are to be construed in accordance with established doctrines of claim interpretation.

What is claimed is:

1. A semiconductor device, comprising:
a substrate;
a channel area above the substrate and including a channel III-V material; and
a source area above the substrate including a first portion and a second portion of the source area, wherein an interface between the channel area and the source area includes the channel III-V material, the second portion of the source area is adjacent to the interface between the channel area and the source area, the first portion of the source area is separated from the interface between the channel area and the source area by the second portion of the source area, the first portion of the source area includes a first III-V material, and the second portion of the source area includes a second III-V material, and wherein the channel III-V material has a channel material bandgap and a lattice constant, the first III-V material has a first bandgap and the lattice constant, the second III-V material has a second bandgap and the lattice constant, and the channel material bandgap, the second bandgap, and the first bandgap form a monotonic sequence of bandgaps.

2. The semiconductor device of claim 1, wherein the source area further includes a sequence of multiple portions between the first portion of the source area and the second portion of the source area, a portion of the multiple portions includes an III-V material with a bandgap of the portion and the lattice constant, and the channel material bandgap, the second bandgap, the bandgap of the portion for the portion of the multiple portions, and the first bandgap form a monotonic sequence of bandgaps.

3. The semiconductor device of claim 2, wherein the channel area, the second portion of the source area, the multiple portions between the first portion of the source area and the second portion of the source area, and the first portion of the source area together form a staircase shape.

4. The semiconductor device of claim 1, wherein the channel material bandgap is larger than the second bandgap, and the second bandgap is larger than the first bandgap.

5. The semiconductor device of claim 4, wherein the channel material bandgap is larger than the second bandgap by a first difference, and the second bandgap is larger than the first bandgap by a second difference substantially equal to the first difference.

6. The semiconductor device of claim 1, wherein the second portion of the source area includes a vertical part in parallel with a sidewall of the channel area.

7. The semiconductor device of claim 6, wherein the second portion of the source area further includes a horizontal part in parallel to a surface of the substrate.

8. The semiconductor device of claim 1, further comprising:
a source electrode coupled to the source area;
a drain area above the substrate including a first portion and a second portion of the drain area, wherein an interface between the channel area and the drain area includes the channel III-V material, the second portion of the drain area is adjacent to the interface between the channel area and the drain area, the first portion of the drain area is separated from the interface between the channel area and the drain area by the second portion of the drain area, the first portion of the drain area includes the first III-V material, and the second portion of the drain area includes the second III-V material;
a drain electrode coupled to the drain area;
a high-k gate dielectric layer on the channel area; and
a gate electrode separated from the channel area by the high-k gate dielectric layer.

9. The semiconductor device of claim 1, wherein the channel area includes the interface between the channel area and the source area as an outer area of the channel area, and an inner channel area adjacent to the interface, and the inner channel area includes an inner channel III-V material different from the channel III-V material in the interface.

10. The semiconductor device of claim 1, wherein the channel area includes a channel selected from the group consisting of a FinFET channel, a nanowire channel, a nanotube channel, and a nanoribbon channel.

11. The semiconductor device of claim 1, wherein the channel III-V material, the first III-V material, or the second III-V material includes a material selected from the group consisting of indium (In), phosphorus (P), gallium (Ga), and arsenic (As).

12. The semiconductor device of claim 1, wherein the channel III-V material includes InP, the first III-V material includes InGaAs, and the second III-V material includes $In_xGa_{1-x}As_yP_{1-y}$.

13. The semiconductor device of claim 1, wherein the substrate includes a material selected from the group consisting of a high-resistivity p-type or n-type vicinal silicon material, germanium, germanium on silicon, gallium arsenide (GaAs), and a silicon-on-insulator substrate.

14. The semiconductor device of claim 1, wherein the first portion or the second portion of the source area includes n-type dopant.

15. A method for forming a semiconductor device, the method comprising:
forming a channel area above a substrate, wherein the channel area includes a channel III-V material;
forming a second portion of a source area above the substrate adjacent to the channel area, wherein the second portion of the source area includes a second III-V material; and
forming a first portion of the source area above the substrate adjacent to the second portion of the source area, wherein the first portion of the source area includes a first III-V material;
wherein the channel III-V material has a channel material bandgap and a lattice constant, the first III-V material has a first bandgap and the lattice constant, the second III-V material has a second bandgap and the lattice constant, and the channel material bandgap, the second bandgap, and the first bandgap form a monotonic sequence of bandgaps.

16. The method of claim 15, wherein the second portion of the source area includes a vertical part in parallel with a sidewall of the channel area, and a horizontal part in parallel to a surface of the substrate.

17. The method of claim 15, further comprising:
forming a second portion of a drain area above the substrate adjacent to the channel area, wherein the second portion of the drain area includes the second III-V material; and forming a first portion of the drain area above the substrate adjacent to the second portion of the drain area, wherein the first portion of the drain area includes the first III-V material.

18. The method of claim 17, further comprising:
forming a high-k gate dielectric layer on the channel area;
forming a gate electrode separated from the channel area by the high-k gate dielectric layer;
forming a source electrode coupled to the source area; and
forming a drain electrode coupled to the drain area.

19. The method of claim 15, further comprising:
forming a sequence of multiple portions of the source area between the first portion of the source area and the second portion of the source area, a portion of the multiple portions includes an III-V material with a bandgap of the portion and the lattice constant, and the channel material bandgap, the second bandgap, the bandgap of the portion for the portion of the multiple portions, and the first bandgap form a monotonic sequence of bandgaps.

20. The method of claim 15, wherein the channel material bandgap is larger than the second bandgap by a first difference, and the second bandgap is larger than the first bandgap by a second difference substantially equal to the first difference.

21. The method of claim 15, wherein the lattice constant is 5.86 A, the channel III-V material includes InP, the channel material bandgap is 1.35 eV, the first III-V material includes $In_{0.53}Ga_{0.47}As$, the first bandgap is 0.74 eV, the second III-V material includes $In_xGa_{1-x}As_yP_{1-y}$, the second bandgap is 0.95 eV.

22. A computing device, comprising:
a processor; and
a memory device coupled to the processor, wherein the memory device or the processor includes a transistor comprising:
a substrate;
a channel area above the substrate and including a channel III-V material; and
a source area above the substrate including a first portion and a second portion of the source area, wherein an interface between the channel area and the source area includes the channel III-V material, the second portion of the source area is adjacent to the interface between the channel area and the source area, the first portion of the source area is separated from the interface between the channel area and the source area by the second portion of the source area, the first portion of the source area includes a first III-V material, and the second portion of the source area includes a second III-V material, and wherein the channel III-V material has a channel material bandgap and a lattice constant, the first III-V material has a first bandgap and the lattice constant, the second III-V material has a second bandgap and the lattice constant, and the channel material bandgap, the second bandgap, and the first bandgap form a monotonic sequence of bandgaps.

23. The computing device of claim 22, wherein the source area further includes a sequence of multiple portions between the first portion of the source area and the second portion of the source area, a portion of the multiple portions includes an III-V material with a bandgap of the portion and the lattice constant, and the channel material bandgap, the second bandgap, the bandgap of the portion for the portion of the multiple portions, and the first bandgap form a monotonic sequence of bandgaps.

24. The computing device of claim 22, wherein the lattice constant is 5.86 A, the channel III-V material includes InP, the channel material bandgap is 1.35 eV, the first III-V material includes $In_{0.53}Ga_{0.47}As$, the first bandgap is 0.74 eV, the second III-V material includes $In_xGa_{1-x}As_yP_{1-y}$, the second bandgap is 0.95 eV.

25. The computing device of claim 22, wherein the computing device is a wearable device or a mobile computing device, the wearable device or the mobile computing device including one or more selected from the group consisting of an antenna, a touchscreen controller, a battery, an audio codec, a video codec, a power amplifier, a global positioning system (GPS) device, a compass, a Geiger counter, an accelerometer, a gyroscope, a speaker, and a camera coupled with the processor.

* * * * *